United States Patent
Naito et al.

[11] Patent Number: 5,994,927
[45] Date of Patent: Nov. 30, 1999

[54] CIRCUIT FOR COMPARISON OF SIGNAL VOLTAGE WITH REFERENCE VOLTAGE

[75] Inventors: Hidetoshi Naito; Tatsuya Matsudo, both of Kawasaki, Japan

[73] Assignee: Fujitsu Limited, Kawasaki, Japan

[21] Appl. No.: 09/059,903

[22] Filed: Apr. 15, 1998

[30] Foreign Application Priority Data

Jul. 29, 1997 [JP] Japan .................................. 9-203320

[51] Int. Cl.⁶ .................................................. H03K 5/153
[52] U.S. Cl. .................................................. 327/72; 327/77
[58] Field of Search .............................. 327/72, 73, 558, 327/91, 94, 354, 77

[56] References Cited

U.S. PATENT DOCUMENTS

| | | | |
|---|---|---|---|
| 4,749,879 | 6/1988 | Peterson et al. | 327/72 |
| 5,142,554 | 8/1992 | Stribling et al. | 327/72 |
| 5,392,317 | 2/1995 | Cho et al. | 327/72 |
| 5,434,535 | 7/1995 | Tomasini et al. | 327/558 |
| 5,438,289 | 8/1995 | Kan et al. | 327/72 |
| 5,712,475 | 1/1998 | Ohno | 327/72 |

FOREIGN PATENT DOCUMENTS 4-216215  8/1992  Japan .

Primary Examiner—Toan Tran
Attorney, Agent, or Firm—Armstrong, Westerman, Hattori, McLeland & Naughton

[57] ABSTRACT

A circuit includes a middle-voltage-detection circuit which detects a substantially middle voltage between a HIGH level and a LOW level of a signal voltage, and supplies the substantially middle voltage as a reference voltage. The circuit further includes a differential amplifier which receives the signal voltage and the reference voltage.

5 Claims, 9 Drawing Sheets

CIRCUIT FOR COMPARISON OF SIGNAL VOLTAGE WITH REFERENCE VOLTAGE

BACKGROUND OF THE INVENTION

1. Field of the Invention

The present invention generally relates to circuits used in voltage-detection circuits or the like, and particularly relates to a circuit which detects an input voltage level by comparing the input voltage level with a reference voltage.

2. Description of the Related Art

When a signal input to one of the two nodes of a differential amplifier is compared with a reference voltage in ICs, a positive input node generally receives the signal, and a negative input node receives the reference voltage.

FIG. 1 is an illustrative drawing showing a signal-input configuration with regard to a differential amplifier.

A signal voltage Vs from a signal supplying circuit 201 is supplied to one input node of the differential amplifier 202. The other input node of the differential amplifier 202 receives a reference voltage Vref from a reference-voltage-generation circuit 203. The differential amplifier 202 compares the signal voltage Vs with the reference voltage Vref, and outputs a signal according to a comparison result as to which one of the signal voltage Vs and the reference voltage Vref is larger than the other. The reference voltage Vref is controlled via a reference-voltage control note. This control is aimed at adjusting the reference voltage Vref to a voltage level appropriate for detecting a signal level of the signal voltage Vs.

In the configuration of FIG. 1, the signal voltage Vs from the signal supplying circuit 201 is prone to undesirable changes because of variations in temperature and/or a power voltage level. If the changes are not commensurate with changes in the reference voltage Vref from the reference-voltage-generation circuit 203, operations of the differential amplifier 202 may suffer errors.

FIG. 2 is an illustrative drawing showing relations between the signal voltage Vs and the reference voltage Vref.

As shown on the left-hand side of the figure, the reference voltage Vref is situated at a midpoint between a HIGH level and a LOW level of the signal voltage Vs when the reference voltage Vref is appropriately adjusted. When the signal voltage Vs changes because of variations in temperature and/or a power voltage, the HIGH level of the signal voltage Vs may decline, for example, as shown in the center of FIG. 2, so as to end up having a narrow gap between the HIGH level and the reference voltage Vref. As shown on the right-hand side of FIG. 2, the LOW level of the signal voltage Vs may be lifted, for example, so as to come closer to the reference voltage Vref.

When the relationship between the signal voltage Vs and the reference voltage Vref deviates from an optimal condition as shown in the center or on the right-hand side of FIG. 2, a signal level of the signal voltage Vs may be erroneously detected. In addition, such a condition may cause a problem in that an effort to increase a signal frequency may be hampered.

A device used as the signal supplying circuit 201 is bound to have variations in circuit characteristics thereof, so that the signal voltage Vs may differ from circuit to circuit. In order to keep the reference voltage Vref at an optimal voltage, therefore, the reference voltage Vref needs to be set to a different voltage level when a different signal supplying circuit is used. Namely, a step of adjusting the reference voltage Vref needs to be incorporated into steps of building a whole circuit, thereby incurring excessive time and labor.

In order to obviate the above-identified problems, a circuit disclosed in the Japanese Patent Laid-open Application No.4-216215 uses a capacitor connection to convey only an AC component of a signal voltage, and this AC component is also added to a reference voltage to keep optimal relations between the signal voltage and the reference voltage.

FIG. 3 is a circuit diagram of this circuit which keeps optimal relations between a signal voltage and a reference voltage.

In the circuit of FIG. 3, a resistor R and a capacitor C are provided in addition to the circuit of FIG. 1. The capacitor C provides a capacitor connection for the signal voltage Vs so as to convey only an alternate-current component of the signal voltage Vs to the differential amplifier 202 by removing a direct current component. The resistor R connects between the two input nodes of the differential amplifier 202. In this manner, the signal-input node of the differential amplifier 202 is provided with a signal which is a sum of the direct-current component of the reference voltage Vref and the alternate-current component of the signal voltage Vs. As a result, the differential amplifier 202 ens up comparing the reference voltage Vref with a signal showing a variation between a HIGH level and a LOW level centering at the reference voltage Vref. An optimal voltage-level relations can thus be achieved.

The circuit of FIG. 3, however, needs a step of adjusting the reference voltage Vref for each different circuit, requiring excessive time and labor for the manufacture of the circuit. Further, use of the reference-voltage-generation circuit 203, which is comprised of variable resistors and the like, entails increases in the number of total circuit elements, a circuit size, and power consumption.

Accordingly, there is a need for a circuit configuration, used for input signals in a differential amplifier, which can keep optimal relations between a signal voltage and a reference voltage regardless of a variation in the signal voltage.

Further, there is a need for a circuit configuration, used for input signals in a differential amplifier, which does not require the reference voltage to be adjusted for each different circuit.

Further, there is a need for a circuit configuration, used for input signals in a differential amplifier, which does not use a reference-voltage-generation circuit so as to reduce the number of circuit elements, a circuit size, and power consumption.

SUMMARY OF THE INVENTION

Accordingly, it is a general object of the present invention to provide a circuit configuration, used for input signals in a differential amplifier, which can satisfy the needs described in the above.

It is another and more specific object of the present invention to provide a circuit configuration, used for input signals in a differential amplifier, which can keep optimal relations between a signal voltage and a reference voltage regardless of a variation in the signal voltage.

It is yet another object of the present invention to provide a circuit configuration, used for input signals in a differential amplifier, which does not require the reference voltage to be adjusted for each different circuit.

It is still another object of the present invention to provide a circuit configuration, used for input signals in a differential amplifier, which does not use a reference-voltage-generation circuit so as to reduce the number of circuit elements, a circuit size, and power consumption.

In order to achieve the above objects, a circuit according to the present invention includes a middle-voltage-detection circuit which detects a substantially middle voltage between a HIGH level and a LOW level of a signal voltage, and supplies the substantially middle voltage as a reference voltage. The circuit further includes a differential amplifier which receives the signal voltage and the reference voltage.

In the circuit described above, one input of the differential amplifier receives the signal voltage, and the other input of the differential amplifier receives a middle voltage between the HIGH level and the LOW level of the signal voltage as the reference voltage, so that relationships between the signal voltage and the reference voltage are not affected by variations in temperature and/or power voltage, and are kept optimal. Further, since the reference voltage is automatically detected based on the signal voltage, there is no need to adjust the reference voltage for each different circuit.

According to one aspect of the present invention, the circuit is such that the middle-voltage-detection circuit detects a substantially average voltage of the signal voltage, and supplies the substantially average voltage as the reference voltage.

In the circuit described above, the average voltage of the signal voltage is supplied to the differential amplifier as the reference voltage, relationships between the signal voltage and the reference voltage are not affected by variations in temperature and/or power voltage, and are kept optimal. Further, since the reference voltage is automatically detected based on the signal voltage, there is no need to adjust the reference voltage for each different circuit.

According to another aspect of the present invention, the circuit is such that the middle-voltage-detection circuit includes a low-pass filter which cuts off alternate-currency components of the signal voltage to extract a direct-current component of the signal voltage.

In the circuit described above, use of the low-pass filter makes it possible to cut off the alternate-current components of the signal voltage to extract the average voltage. Since the low-pass filter can be implemented by a simple circuit structure using a small number of circuit elements, the number of circuit elements, a circuit size, and power consumption can be reduced.

According to another aspect of the present invention, the circuit is such that the middle-voltage-detection circuit includes a resistor having one end which receives the signal voltage, and a capacitor connected in series to another end of the resistor, wherein a voltage charged in the capacitor is supplied as the reference voltage.

In the circuit described above, the middle-voltage-detection circuit is implemented by a simple structure using the resistor and the capacitor, so that the number of circuit elements, a circuit size, and power consumption can be reduced.

According to another aspect of the present invention, the circuit is such that the capacitor is a parasitic capacitance for signal inputs to the differential amplifier.

In the circuit described above, the middle-voltage-detection circuit is implemented by using the resistor and the parasitic capacitor which is nonexistent as a tangible circuit element, so that the number of circuit elements, a circuit size, and power consumption can be further reduced.

According to another aspect of the present invention, the circuit is such that the middle-voltage-detection circuit includes an inductor having one end which receives said signal voltage, and a capacitor connected in series to another end of the inductor, wherein a voltage charged in the capacitor is supplied as the reference voltage.

In the circuit described above, the middle-voltage-detection circuit is implemented by a simple structure using the inductor and the capacitor, so that the number of circuit elements, a circuit size, and power consumption can be reduced. Further, use of the inductor makes it possible to strongly suppress the alternate-current components of the signal voltage in contrast to the use of the resistor, thereby providing a more stable average voltage.

According to another aspect of the present invention, the circuit is such that the capacitor is a parasitic capacitance for signal inputs to the differential amplifier.

In the circuit described above, the middle-voltage-detection circuit is implemented by using the inductor and the parasitic capacitor which is nonexistent as a tangible circuit element, so that the number of circuit elements, a circuit size, and power consumption can be further reduced.

According to another aspect of the present invention, the circuit is such that the middle-voltage-detection circuit includes a circuit element including an inductor and a resistor and having one end which receives the signal voltage, and a capacitor connected in series to another end of the circuit element, wherein a voltage charged in the capacitor is supplied as the reference voltage.

In the circuit described above, the middle-voltage-detection circuit is implemented by a simple structure using the inductor, the resistor, and the capacitor, so that the number of circuit elements, a circuit size, and power consumption can be reduced. Further, use of the inductor achieves frequency characteristics having a sharp decline in the frequency response, which is suitable for suppressing the alternate-current components of the signal voltage. Also, this configuration does not have a signal oscillation at a resonant frequency, thereby providing a more stable average voltage.

According to another aspect of the present invention, the circuit is such that the capacitor is a parasitic capacitance for signal inputs to the differential amplifier.

In the circuit described above, the middle-voltage-detection circuit is implemented by using the inductor, the resistor, and the parasitic capacitor which is non-existent as a tangible circuit element, so that the number of circuit elements, a circuit size, and power consumption can be further reduced.

According to one aspect of the present invention, a circuit of the present invention includes a first circuit which supplies a reference voltage based on a signal voltage, and a second circuit which detects a signal level of the signal voltage by using the reference voltage.

In the circuit described above, the second circuit detects the signal level of the signal voltage by using the reference voltage which is dependent on the signal voltage, so that relationships between the signal voltage and the reference voltage are not affected by variations in temperature and/or power voltage, and are kept optimal. Further, since the reference voltage is automatically detected based on the signal voltage, there is no need to adjust the reference voltage for each different circuit.

Other objects and further features of the present invention will be apparent from the following detailed description when read in conjunction with the accompanying drawings.

DESCRIPTION OF THE PREFERRED EMBODIMENTS

In the following, a principle and embodiments of the present invention will be described with reference to the accompanying drawings.

Figure 1:
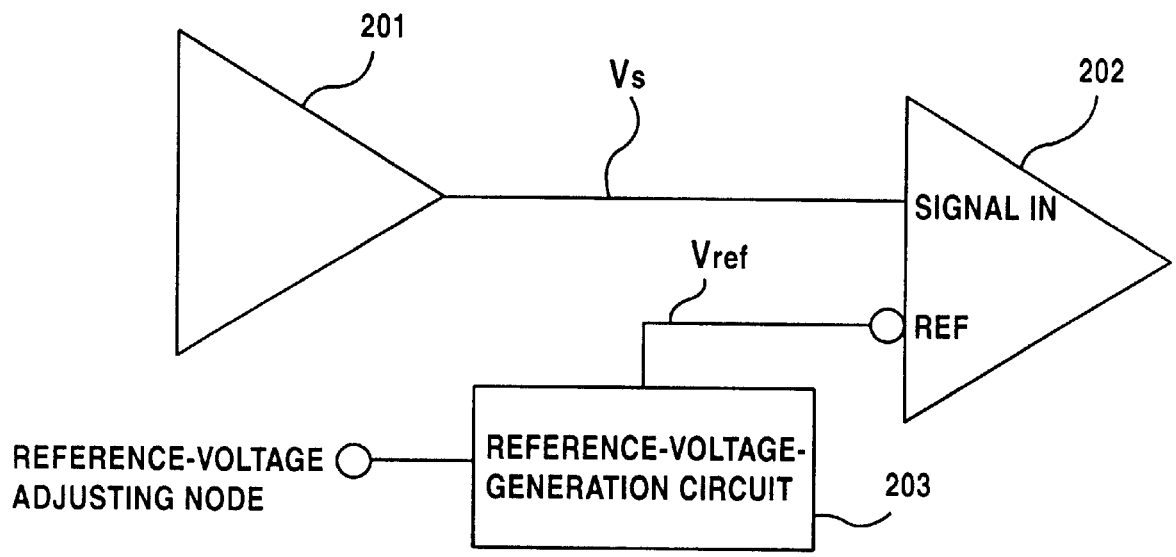
FIG. 1 is an illustrative drawing showing a related-art signal-input configuration with regard to a differential amplifier.
Figure 2:
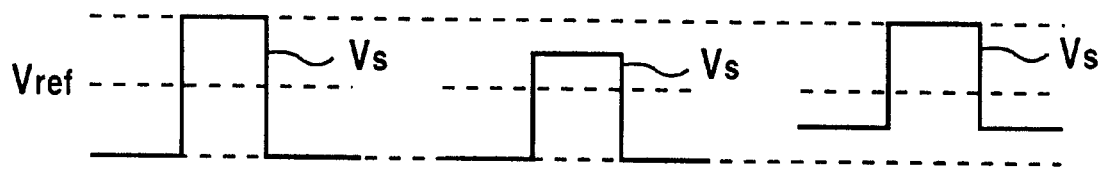
FIG. 2 is an illustrative drawing showing relations between the signal voltage Vs and the reference voltage Vref.
Figure 3:
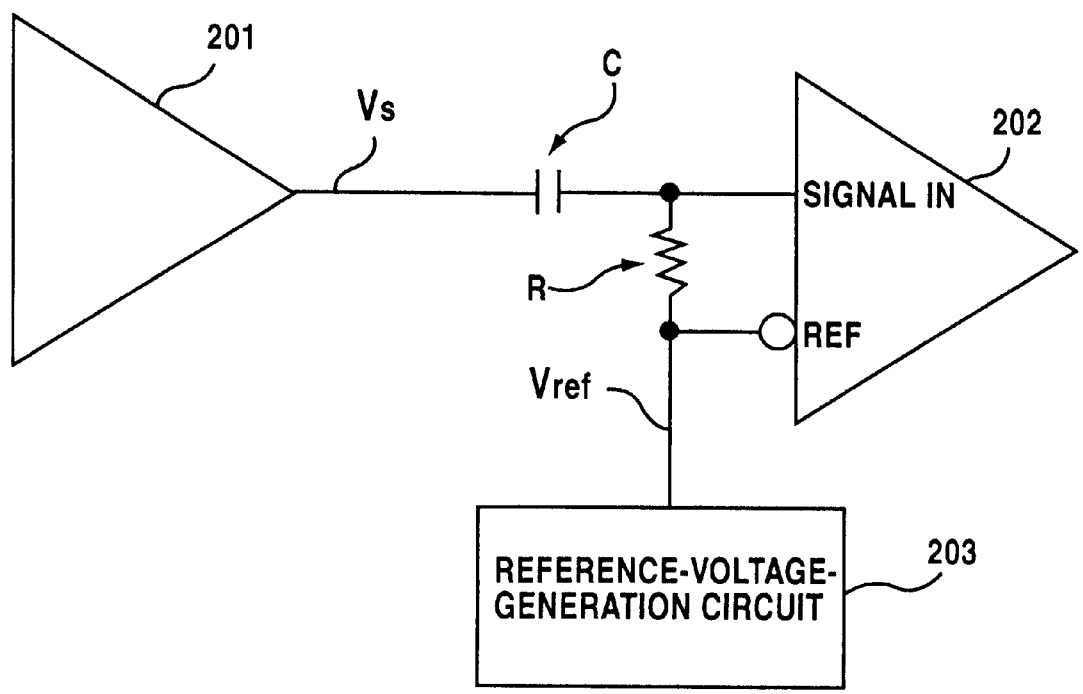
FIG. 3 is a circuit diagram of a related-art circuit which keeps optimal relations between a signal voltage and a reference voltage.
Figure 4:
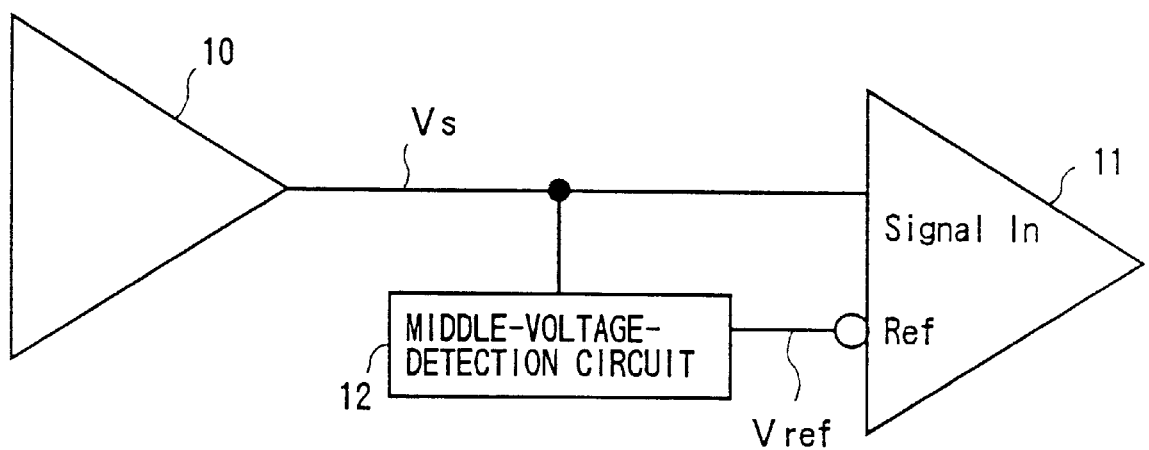
FIG. 4 is a circuit diagram of a circuit according to the principle of the present invention.

FIG. 4 is a circuit diagram of a circuit according to the principle of the present invention.

In FIG. 4, the signal voltage Vs supplied from a signal supplying circuit 10 is input to a signal input node of a differential amplifier 11, and is also provided to a middle-voltage-detection circuit 12. The middle-voltage-detection circuit 12 detects a middle voltage between a HIGH level and a LOW level of the signal voltage Vs, and supplies the middle voltage as the reference voltage Vref to the differential amplifier 11.

In this manner, one input of the differential amplifier 11 receives the signal voltage Vs, and the other input receives the middle voltage between the HIGH level and the LOW level of the signal voltage Vs as the reference voltage Vref. Because of this configuration, optimal relationships between the signal voltage Vs and the reference voltage Vref are maintained even when there are variations in the signal voltage Vs caused by changes in temperature and a power voltage.

Since the reference voltage Vref is automatically generated based on the signal voltage Vs, there is no need to adjust the reference voltage Vref for each different circuit.

Figure 5:
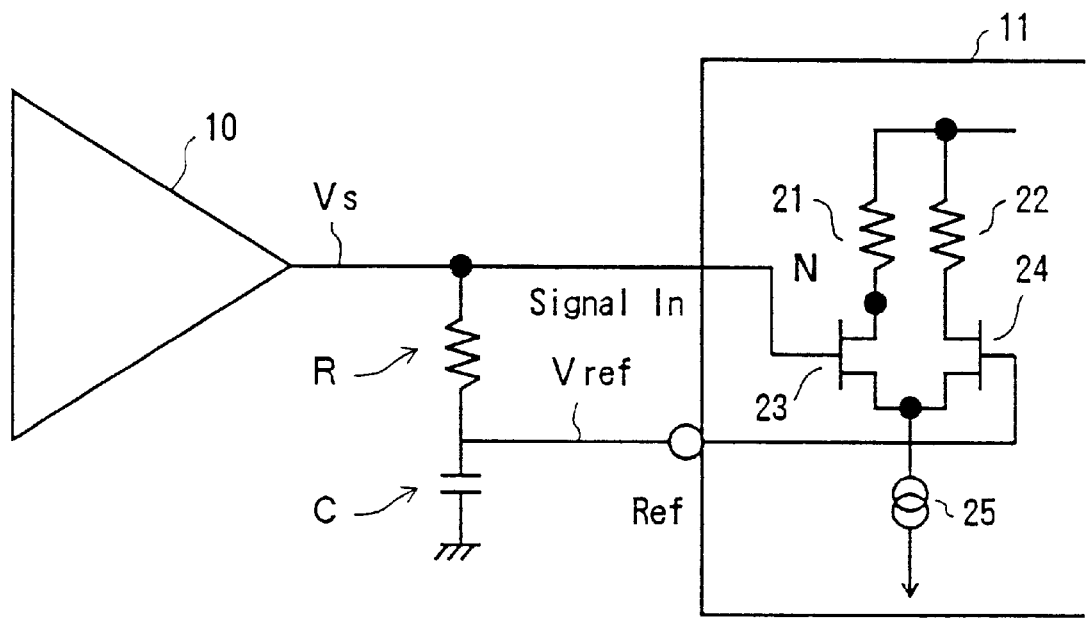
FIG. 5 is a circuit diagram of a first embodiment of a circuit according to the present invention.

FIG. 5 is a circuit diagram of a first embodiment of a circuit according to the present invention.

In FIG. 5, a resistor R and a capacitor C together form the middle-voltage-detection circuit 12 of FIG. 4. Further, the differential amplifier 11 includes resistors 21 and 22, transistors 23 and 24, and a constant-current-supply source 25 in an example of FIG. 4.

The resistor R and capacitor C actually detects an average voltage of the signal voltage Vs as an approximation of a middle voltage rather than detecting the middle voltage of the signal voltage Vs, and supplies the average voltage to the differential amplifier 11 as the reference voltage Vref. When appearance of the HIGH level of the signal voltage Vs and appearance of the LOW level of the signal voltage Vs have almost equal frequency and time periods such as in the case of a clock signal, the average voltage is nearly equal to the middle voltage. Although being subject to a type of the signal voltage Vs, approximation of the middle voltage by the average voltage as shown in FIG. 4 generally does not cause a problem in digital systems in practice.

The resistor R and the capacitor C together form a low-pass filter. Defining a filter frequency band by points of a 3 dB fall in frequency responses, the filter frequency band is represented as:

$$f3\ dB = 1/(2\pi CR) \tag{1}$$

If the resistor R and the capacitor C are appropriately set, alternate-current components of the signal voltage Vs can be removed to obtain the average voltage of the signal voltage Vs. In order to achieve this, the resistor R and the capacitor C should be set such that a frequency range of the signal components (alternate-current components) of the signal voltage Vs is situated outside the filter frequency band, i.e., such that f3 dB given in the above equation (1) is smaller than the frequencies of the signal components.

In the differential amplifier 11, when the signal voltage Vs is higher than the reference voltage Vref, the transistors 23 and 24 are turned on and off, respectively, thereby bringing a voltage level at a node N to LOW. When the signal voltage Vs is lower than the reference voltage Vref, on the other hand, the transistors 23 and 24 are turned of and on, respectively. In this case, the voltage level at the node N becomes HIGH. The voltage level at the node N, for example, may be supplied as an output of the differential amplifier 11.

In the first embodiment of FIG. 5, as described above, the middle-voltage-detection circuit 12 detects the average voltage of the signal voltage Vs, and supplies it to the differential amplifier 11 as the reference voltage Vref, so that the relationships between the signal voltage Vs and the reference voltage Vref are not affected by variations in temperature and/or power voltage, and are kept optimal.

Further, since the reference voltage Vref is automatically generated based on the signal voltage Vs, there is no need to adjust the reference voltage Vref for each different circuit.

Moreover, the middle-voltage-detection circuit 12 has a simple circuit structure comprised of the resistor R an the capacitor C, so that the number of circuit elements, a circuit size, and power consumption can be reduced compared to the case in which a reference-voltage-generation circuit is used as in the related art.

Figure 6:
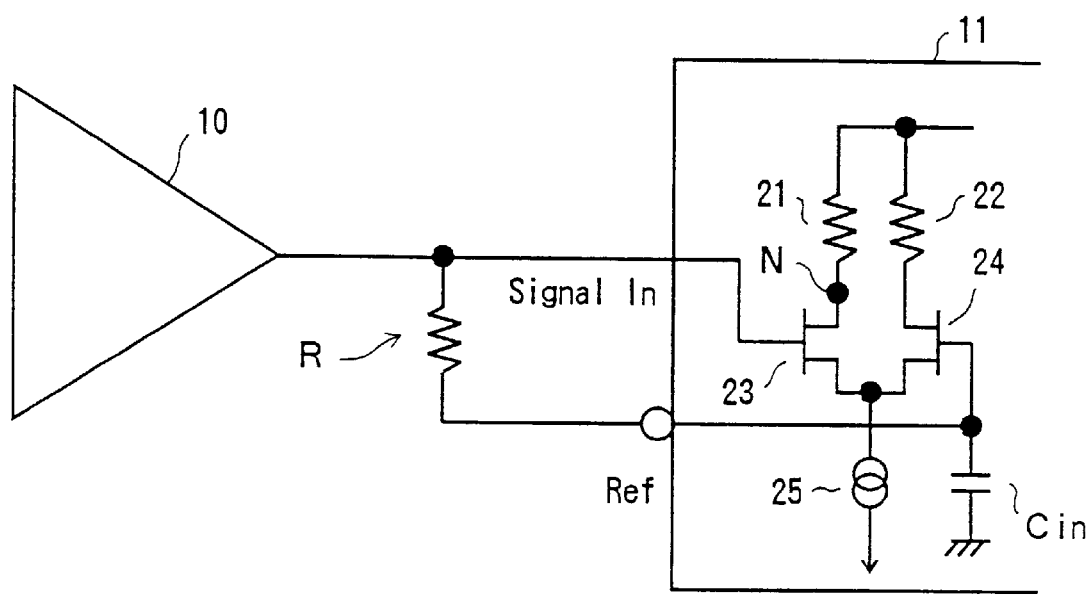
FIG. 6 is a circuit diagram of a second embodiment of a circuit according to the present invention.

FIG. 6 is a circuit diagram of a second embodiment of a circuit according to the present invention.

In FIG. 6, the differential amplifier 11 includes a parasitic capacitance Cin of transistors in addition to the resistors 21 and 22, the transistors 23 and 24, and the constant-current-supply source 25. The parasitic capacitance Cin inevitably exists in a real circuit. In the previous example of FIG. 5, however, the parasitic capacitance Cin is not explicitly shown based on a notion that the parasitic capacitance Cin is much smaller than the capacitor C or is included in the capacitor C.

When FETs (field effect transistors) are used as the transistors 23 and 24 in the differential amplifier 11, the parasitic capacitance Cin for input signals is provided as:

$$Cin = Cgs + (1+A)\ Cgd \tag{2}$$

Here, Cgs represents a gate-source parasitic capacitance, and Cgd is a gate-drain parasitic capacitance. Further, "A" represents a differential-amplifier gain (the second term in the equation (2) is provided to take into account a mirror effect).

When bipolar transistors are used, the parasitic capacitance Cin for input signals is represented as:

$$Cin = A\, Ccb \quad (3)$$

Here, Ccb is a base-emitter parasitic capacitance, and "A" represents a differential-amplifier gain (the gain provided as a multiplication factor takes into account the mirror effect).

The resistor R and the parasitic capacitance Cin together form a low-pass filter. Defining a filter frequency band by points of a 3 dB fall in frequency responses, the filter frequency band is represented as:

$$f3\, dB = 1/(2\pi CinR) \quad (4)$$

If the resistor R is appropriately set, alternate-current components of the signal voltage Vs can be removed to obtain the average voltage of the signal voltage Vs. In order to achieve this, the resistor R should be set such that a frequency range of the signal components (alternate-current components) of the signal voltage Vs is situated outside the filter frequency band, i.e., such that f3 dB given in the above equation (4) is smaller than the frequencies of the signal components.

In the second embodiment of FIG. 6, as described above, the middle-voltage-detection circuit 12 detects the average voltage of the signal voltage Vs, and supplies it to the differential amplifier 11 as the reference voltage Vref, so that the relationships between the signal voltage Vs and the reference voltage Vref are not affected by variations in temperature and/or power voltage, and are kept optimal.

Further, since the reference voltage Vref is automatically generated based on the signal voltage Vs, there is no need to adjust the reference voltage Vref for each different circuit.

Moreover, the middle-voltage-detection circuit 12 is comprised of the resistor R and the parasitic capacitance Cin, which is not existent as a circuit element. The number of circuit elements and a circuit size thus can be further reduced compared to the first embodiment.

Figure 7:
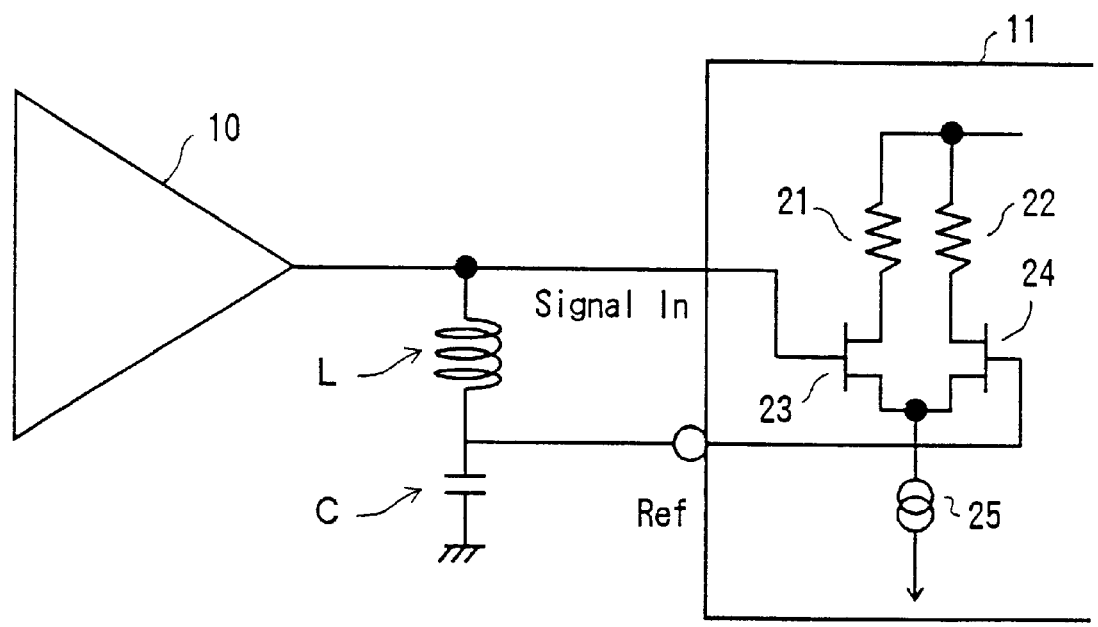
FIG. 7 is a circuit diagram of a third embodiment of a circuit according to the present invention.

FIG. 7 is a circuit diagram of a third embodiment of a circuit according to the present invention.

In FIG. 7, an inductor L and the capacitor C together form the middle-voltage-detection circuit 12 of FIG. 4. Here, a parasitic capacitance of transistors is not shown in the figure as being much smaller than or included in the capacitor C.

The inductor L and the capacitor C together make up a filter whose frequency response has a rapid decline in a frequency range higher than a resonant frequency. The resonant frequency is provided as:

$$fr = 1/\{2\pi(LC)^{1/2}\} \quad (5)$$

If the capacitor C and the inductor L are appropriately set, alternate-current components of the signal voltage Vs can be removed to obtain the average voltage of the signal voltage Vs. In order to achieve this, the capacitor C and the inductor L should be set such that a frequency range of the signal components (alternate-current components) of the signal voltage Vs is situated outside the resonant frequency fr, i.e., such that the resonant frequency fr given in the above equation (5) is smaller than the frequencies of the signal components. The average voltage of the signal voltage Vs is thus obtained, and is used as the reference voltage Vref.

In the third embodiment of FIG. 7, as described above, relationships between the signal voltage Vs and the reference voltage Vref are kept optimal, and there is no need to adjust the reference voltage Vref for each different circuit.

Further, the middle-voltage-detection circuit 12 of the third embodiment uses the inductor L in place of the resistor in contrast to the first and second embodiments, so that strong suppression of the alternate-current components can be achieved, thereby helping to obtain the average voltage with the alternate-current components being highly suppressed. The third embodiment, however, has a drawback in that an inductor element, which is implemented as a spiral coil in integrated circuits, occupies a circuit area much larger than a resistor element.

Figure 8:
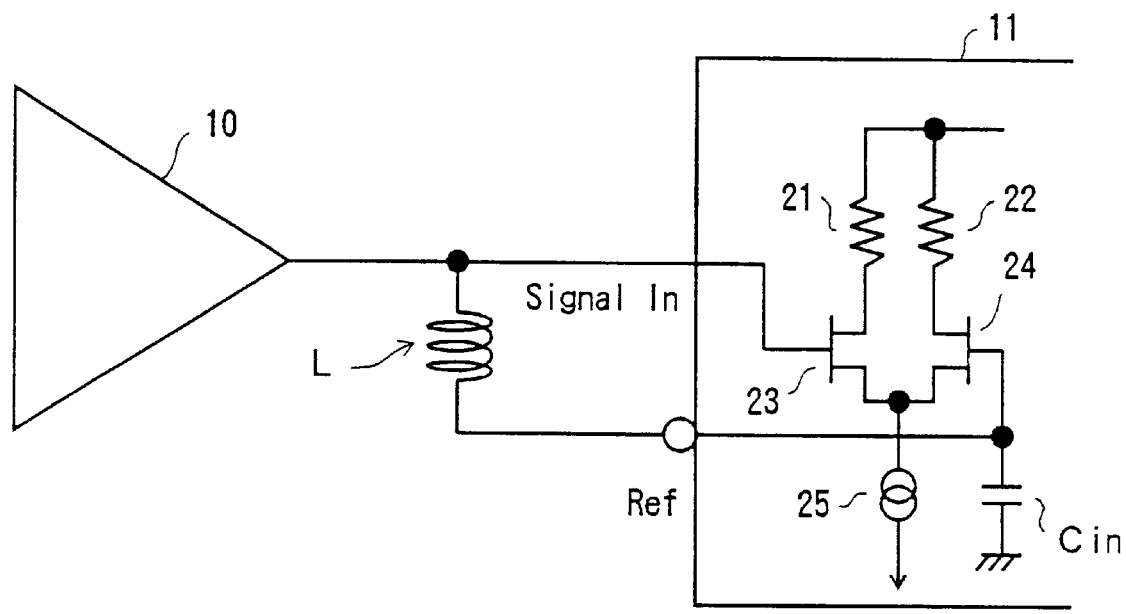
FIG. 8 is a circuit diagram of a fourth embodiment of a circuit according to the present invention.

FIG. 8 is a circuit diagram of a fourth embodiment of a circuit according to the present invention.

In FIG. 8, the differential amplifier 11 includes the parasitic capacitance Cin of transistors in addition to the resistors 21 and 22, the transistors 23 and 24, and the constant-current-supply source 25. The parasitic capacitance Cin is represented as shown in the equation (2) or (3) previously provided.

The inductor L and the capacitor C together make up a filter whose frequency response has a rapid decline in a frequency range higher than a resonant frequency. The resonant frequency is provided as:

$$fr = 1/\{2\pi(LCin)^{1/2}\} \quad (6)$$

If the inductor L is appropriately set, alternate-current components of the signal voltage Vs can be removed to obtain the average voltage of the signal voltage Vs. In order to achieve this, the inductor L should be set such that a frequency range of the signal components (alternate-current components) of the signal voltage Vs is situated outside the resonant frequency fr, i.e., such that the resonant frequency fr given in the above equation (6) is smaller than the frequencies of the signal components.

As described in the above, the middle-voltage-detection circuit 12 of the fourth embodiment is comprised of the inductor L and the parasitic capacitance Cin, which is not existent as a circuit element. The number of circuit elements and a circuit size thus can be further reduced compared to the third embodiment.

Figure 9:
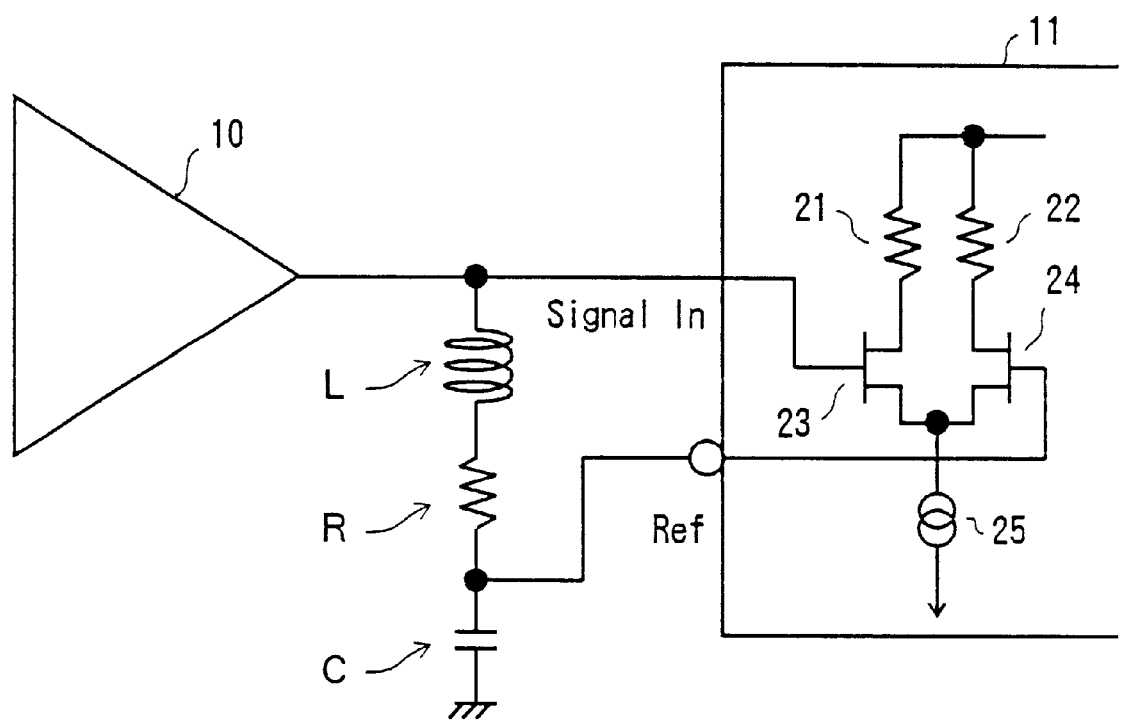
FIG. 9 is a circuit diagram of a fifth embodiment of a circuit according to the present invention.

FIG. 9 is a circuit diagram of a fifth embodiment of a circuit according to the present invention.

In FIG. 9, the inductor L, the resistor R, and the capacitor C together form the middle-voltage-detection circuit 12 of FIG. 4. Here, a parasitic capacitance of transistors is not shown in the figure as being much smaller than or included in the capacitor C.

Frequency characteristics of the circuit comprised of the inductor L, the resistor R, and the capacitor C are represented as:

$$|Vref/Vin| = |1/(1-w^2LC+jwCR)| \quad (7)$$

Here, w is an angular frequency ($=2\pi f$). In the third embodiment previously described, an output signal amplitude becomes infinite at the resonant frequency. On the other hand, the frequency characteristics of the equation (7) can prevent an output amplitude from becoming infinite because the denominator never becomes zero. While this advantage is in place, a filter having a sharp decline in a higher frequency range of the frequency response can be attained in the same manner as in the third embodiment.

If the capacitor C, the resistor R, and the inductor L are set such that a frequency range of signal components (alternate-current components) of the signal voltage Vs is situated outside the filter frequency band, the alternate-current components can be removed to obtain the average voltage of the signal voltage Vs. The average voltage of the signal voltage Vs is then used as the reference voltage Vref.

In the fifth embodiment of FIG. 9, as described above, relationships between the signal voltage Vs and the reference voltage Vref are kept optimal, and there is no need to adjust the reference voltage Vref for each different circuit.

Further, the middle-voltage-detection circuit 12 of the fifth embodiment uses the inductor L, so that strong suppression of the alternate-current components can be achieved, thereby helping to obtain the average voltage with the alternate-current components being highly suppressed. Since the resistor is put in place in a series connection with the inductor, a resonant state can be avoided so as to prevent an output amplitude from becoming abnormally large.

Figure 10:
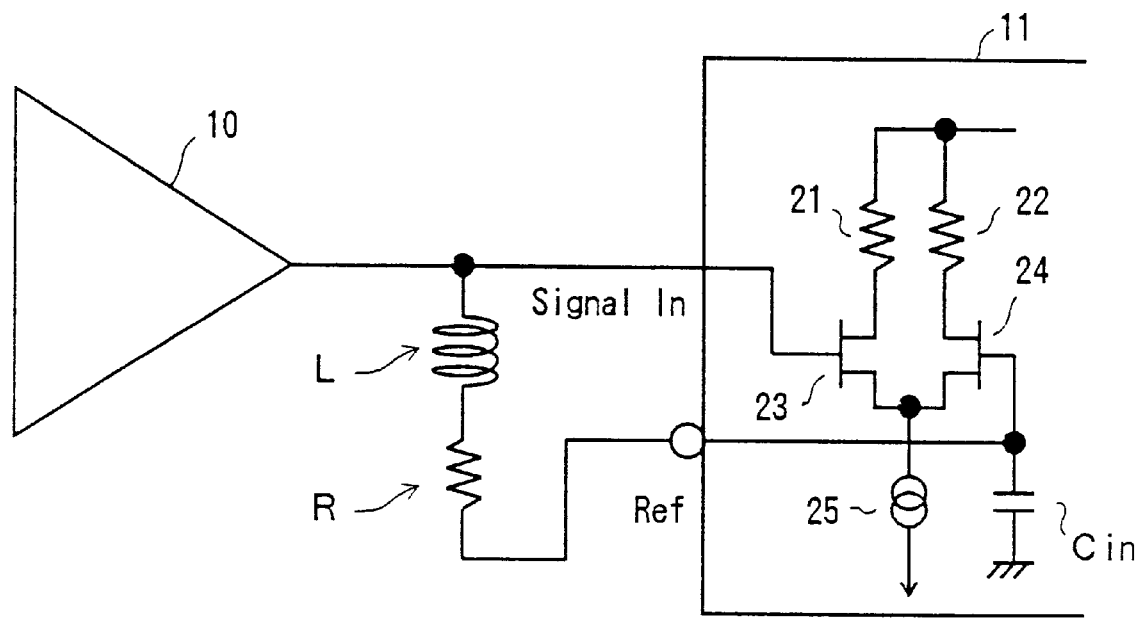
FIG. 10 is a circuit diagram of a sixth embodiment of a circuit according to the present invention.

FIG. 10 is a circuit diagram of a sixth embodiment of a circuit according to the present invention.

In FIG. 10, the differential amplifier 11 includes the parasitic capacitance Cin of transistors in addition to the resistors 21 and 22, the transistors 23 and 24, and the constant-current-supply source 25. The parasitic capacitance Cin is represented as shown in the equation (2) or (3) previously provided.

Frequency characteristics of the circuit comprised of the inductor L, the resistor R, and the parasitic capacitance Cin are represented as:

$$|Vref/Vin|=|1/(1-w^2LCin+jwCinR)| \qquad (8)$$

Here, w is an angular frequency ($=2\pi f$). In the third embodiment previously described, an output signal amplitude becomes infinite at the resonant frequency. On the other hand, the frequency characteristics of the equation (8) can prevent an output amplitude from becoming infinite because the denominator never becomes zero. While this advantage is in place, a filter having a sharp decline in a higher frequency range of the frequency response can be attained in the same manner as in the third embodiment.

As described in the above, the middle-voltage-detection circuit 12 of the sixth embodiment is comprised of the inductor L, the resistor R, and the parasitic capacitance Cin, which is not existent as a circuit element. The number of circuit elements and a circuit size thus can be further reduced compared to the fifth embodiment.

Further, the present invention is not limited to these embodiments, but various variations and modifications may be made without departing from the scope of the present invention.

What is claimed is:

1. A circuit comprising:
   a middle-voltage-detection circuit which detects a substantially middle voltage between a HIGH level and a LOW level of a signal voltage, and supplies said substantially middle voltage as a reference voltage; and
   a differential amplifier which receives said signal voltage and said reference voltage,
   wherein said middle-voltage-detection circuit comprises:
      a resistor having one end which receives said signal voltage; and
      a capacitor connected in series to another end of said resistor, wherein a voltage charged in said capacitor is supplied as said reference voltage, and
   wherein said capacitor comprises a parasitic capacitance for signal inputs to said differential amplifier.

2. A circuit comprising:
   a middle-voltage-detection circuit which detects a substantially middle voltage between a HIGH level and a LOW level of a signal voltage, and supplies said substantially middle voltage as a reference voltage; and
   a differential amplifier which receives said signal voltage and said reference voltage,
   wherein said middle-voltage-detection circuit comprises:
      an inductor having one end which receives said signal voltage; and
      a capacitor connected in series to another end of said inductor, wherein a voltage charged in said capacitor is supplied as said reference voltage.

3. The circuit as claimed in claim 2, wherein said capacitor comprises a parasitic capacitance for signal inputs to said differential amplifier.

4. A circuit comprising:
   a middle-voltage-detection circuit which detects a substantially middle voltage between a HIGH level and a LOW level of a signal voltage, and supplies said substantially middle voltage as a reference voltage; and
   a differential amplifier which receives said signal voltage and said reference voltage,
   wherein said middle-voltage-detection circuit comprises:
      a circuit element including an inductor and a resistor and having one end which receives said signal voltage; and
      a capacitor connected in series to another end of said circuit element, wherein a voltage charged in said capacitor is supplied as said reference voltage.

5. The circuit as claimed in claim 4, wherein said capacitor comprises a parasitic capacitance for signal inputs to said differential amplifier.

* * * * *